(12) United States Patent
Bruno et al.

(10) Patent No.: US 6,976,424 B2
(45) Date of Patent: Dec. 20, 2005

(54) STAMP DEVICE FOR PRINTING A PATTERN ON A SURFACE OF A SUBSTRATE

(75) Inventors: Michel Bruno, Adliswil (CH); Heinz Schmid, Waedenswil (CH); Emmanuel Delamarche, Adliswil (CH); Alexander Bietsch, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/752,616

(22) Filed: Dec. 28, 2000

(65) Prior Publication Data

US 2001/0013294 A1 Aug. 16, 2001

(30) Foreign Application Priority Data

Dec. 31, 1999 (EP) .............................. 99126245

(51) Int. Cl.[7] .............................. B41K 1/06; B41K 1/22; B41K 1/32
(52) U.S. Cl. .......................................... 101/327; 216/45
(58) Field of Search ........................... 101/44, 54, 150, 101/170, 327, 333, 368, 372, 401, 405, 376; 216/41, 45, 44, 54

(56) References Cited

U.S. PATENT DOCUMENTS

| | | | | |
|---|---|---|---|---|
| 5,066,537 A | | 11/1991 | O'Rell et al. ............... 428/246 |
| 5,410,962 A | * | 5/1995 | Collier ....................... 101/368 |
| 5,655,451 A | * | 8/1997 | Wasylczuk et al. ......... 101/368 |
| 5,817,242 A | * | 10/1998 | Biebuyck et al. ............ 216/41 |
| 5,860,360 A | | 1/1999 | Lane, III et al. ............ 101/376 |
| 5,925,259 A | * | 7/1999 | Biebuyck et al. .............. 216/2 |
| 6,027,595 A | * | 2/2000 | Suleski ....................... 156/230 |
| 6,083,628 A | * | 7/2000 | Yializis ....................... 428/463 |
| 6,089,853 A | * | 7/2000 | Biebuyck et al. ........... 101/150 |
| 6,140,023 A | * | 10/2000 | Levinson et al. ........... 430/313 |
| 6,180,239 B1 | * | 1/2001 | Whitesides et al. ...... 428/411.1 |
| 6,223,655 B1 | * | 5/2001 | Shanbaum et al. ......... 101/375 |

FOREIGN PATENT DOCUMENTS

GB       2056883       3/1981

OTHER PUBLICATIONS

A. Bietsch and B. Michel, "Conformal Contact and Pattern Stability of Stamps Used for Soft Lithography", *Journal of Applied Physics*, vol. 88, No. 7, pp. 4310–4318; Oct. 1, 2000.

* cited by examiner

*Primary Examiner*—Stephen R. Funk
(74) *Attorney, Agent, or Firm*—Scully, Scott, Murphy & Presser; Robert M. Trepp

(57) ABSTRACT

A stamp device for printing a pattern on a surface of a substrate having a two-sided rigid carrier layer providing on its first side a patterned layer made of a first material and being combined on its second side with a soft layer made of a softer material than that of the first material.

29 Claims, 8 Drawing Sheets

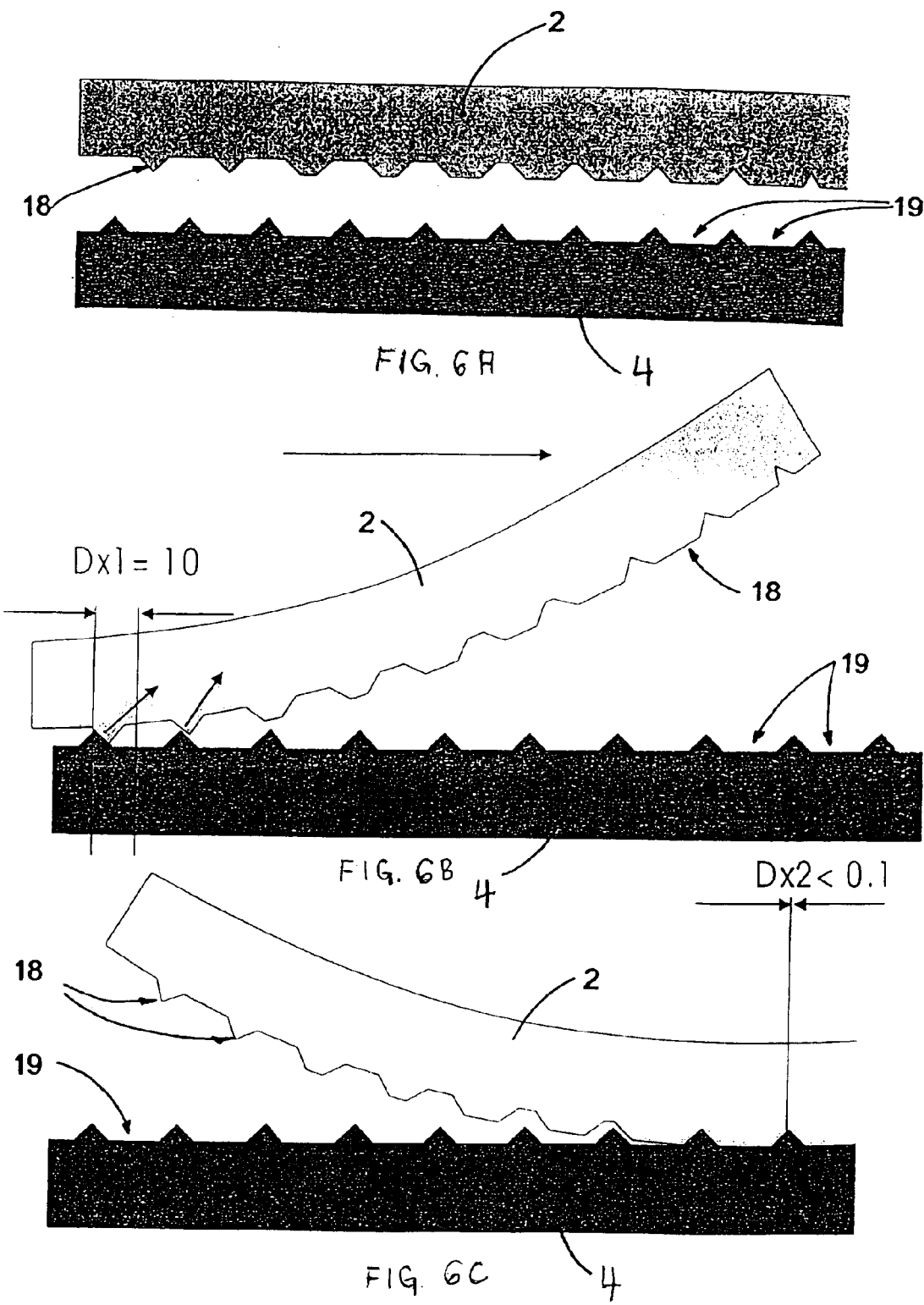

STAMP DEVICE FOR PRINTING A PATTERN ON A SURFACE OF A SUBSTRATE

FIELD OF THE INVENTION

The present invention relates to a stamp device for printing a pattern on a surface of a substrate.

BACKGROUND OF THE INVENTION

Soft lithography, a known technique for transferring micro patterns onto a surface of a substrate serving as the basic structure for integrated circuits, (see also Xia, Y.; Whitesides, G. M. Angew. Chem. Int'l. Ed. 1998, 37, 550) relies on a stamp to bring a reactant in contact with a substrate.

Stamp materials in soft lithography are exposed to capillary forces, self-adhesion, and mechanical stresses during printing. These stresses before or during printing can deform the stamp or cause parts of it to collapse, which leads to defective and inaccurate prints. Most of the work on contact printing has been done using Sylgard 184 manufactured by Dow Corning Corp., Midland, Mich., USA, a commercially available thermo-cured Siloxane polymer, whose structures smaller than 1 µm tend to merge or collapse during inking and printing (see also Biebuyck, H. A.; Larsen, N. B.; Delamarche, E.; Michel, B. IBM J. Res. Develop. 1997, 41, 159).

The diverging demands given by conformability, high pattern stability, small thermal or mechanical expansion, and runout cannot be met by one material alone but require layered structures. A practical method to compensate partially for insufficient dimensional and mechanical stability of polymeric materials is to mold the stamp polymer on top of a rigid glass backplane (see also the article of Biebuyck et al. mentioned above). Such hybrid stamps have a better overall accuracy, but stresses generated upon cooling of the polymer layer cast against rigid supports and the process of printing itself can still account for small non-uniform distortions. Very thin polymer layers (<0.1 mm) reduce this problem but suffer from a severely reduced capability to compensate substrate topography and stamp thickness inhomogeneities. Because of this limitation they are applicable only for lithographies on flat substrates.

Stamps are the key elements in soft lithography because they carry the pattern on their surface and are capable of conformal contact during printing. Soft lithography requires adaptation of the stamp to a potentially uneven substrate but collapse, deformation, and runout must be avoided simultaneously. In fact a careful balance between desired and undesired deformation has to be maintained.

In particular the implementation of mechanized large area printing is crucial for the applicability of soft lithographies in a high-volume manufacturing environment. In this case it is highly important to transfer the pattern of the stamp—in most applications the stamp is inked with a thin layer of chemicals—precisely onto the surface of a substrate which may be of a flat or from flat differing nature. It is a highly sophisticated task to print large area substrates with invariable high quality all over their surfaces.

The development of stamps useable for large area printing leads to thin film hybrid stamps having a stiff backplane that dominates the lateral stability and a thin soft patterned layer as disclosed in WO 97/06012. This known hybrid stamp structure for lithographic processing comprises an elastically deformable layer for accommodating unevenness of the surface of a substrate and of the stamp structure itself, and a patterned layer in which a lithographic pattern is engraved. The stamp structure is further enhanced by a third layer, which acts as rigid support for the stamp, thus preventing an undesired deformation of the stamp. As opposed to the hybrid stamp concept disclosed in WO 97/06012 the deformable layer is not placed in between the pattern carrying layer and the backplane but on the other side of a thin backplane that is partially flexible perpendicular to its plane.

A method of using the stamp as described before for printing surfaces is disclosed in WO 97/06013. The document describes a process for producing lithographic features in a substrate layer by lowering the stamp carrying a reactant onto a substrate, confining the subsequent reaction to the desired pattern, lifting said stamp and removing the debris of the reaction from the substrate. Preferably, the stamp carries the pattern to be etched or depressions corresponding to such a pattern.

Nevertheless a couple of problems still remain for producing large area printed structures on substrates using soft lithography technique:

The larger the to be printed area the greater the possibility of inclusion of air bubbles in the contact plane between the patterned stamp layer and the to be printed surface. For instance, printing of a flat full wafer having a slight bow causes inclusion of air bubbles frequently leading to zones of failed printing due to missing contact between the stamp and the wafer surface.

Inhomogeneities of the thickness of the thin film hybrid stamp due to chemical or thermal shrink and tolerances in the printing tool cause uneven load on different areas of the stamp. This leads to collapse of patterns and/or sagging.

In connection with the before mentioned disadvantage there exists no possibility for control or monitoring the actual surface-distributed load acting onto the stamp while printing to locate printing zones in which ceiling or bottom load limits are exceeded or not even reached. Using well-known force transducers in combination with the printing tool only the overall load can be detected and controlled. Monitoring local force distribution at the contact layer between the stamp and surface however could allow a post-print analysis thus improves the process of soft lithography noticeably.

For providing an accurate alignment between the patterned layer of the stamp and the surface to be printed difficulties can arise in printing large surfaces due to inherent differences of expansion or stretch conditions of the contacting surfaces. Repeated conformal printing of different sets of structures onto a surface inevitably leads to deviations of positioning the stamp towards the surface between each printing event.

Disturbing print contacts between the stamp and the substrate appear in areas of the patterned layer where no structured pattern is provided. If the distance of two neighboring patterned structures is large enough sagging of the receded patterned layer appears from a distinct load of the stamp leading to unintentional prints.

The object of the present invention is to enhance a thin film hybrid stamp in such a way that mechanized large area printing should be possible. The printing results of such a soft lithographic process using the inventive stamp device should be of high quality even in case the contacting plane between the stamp and the substrate's surface differs from a precise smooth and even plane.

It is a further object of the invention to avoid disadvantages as characterized before. The inventive stamp device itself as well in combination with advantageous additional features should be the basis for a precise transfer technique of micron and sub micronscaled structures onto a plane or curved surface.

SUMMARY OF THE INVENTION

A conventional thin film hybrid stamp provides a carrier layer like a flat metal sheet or a thin glass foil onto which one side the patterned layer made of stamp material like PDMS is attached. The carrier layer is rigid in its plane but flexible perpendicular to its plane. The underlying idea of the invention is to contact the other side of the rigid carrier layer with a layer made of a softer material than the patterned layer, at least while contacting the stamp device with the to be printed surface of the substrate. During printing a load acts onto the stamp, which is directed through the soft layer onto the backside of the rigid carrier layer. Under this condition, the soft layer absorbs the majority of the pressure difference created by the load acting on inhomogeneous built stamps or by substrate warp without overloading the stamp pattern. A second effect is the larger contact area between the stamp and the substrate that distributes the added printing force. Tests showed that the local leveling effect of the soft layer is more effective the thinner the rigid carrier layer is.

There are two alternative ways for designing a stamp device according to this invention:

In a first inventive embodiment the stamp device for printing a pattern on a surface of a substrate has a two-sided rigid carrier layer providing on its first side a patterned layer made of a first material and being combined on its second side with a soft layer made of a softer material than said first material.

For establishing a force induced contact between the stamp device and the substrate a press means is used favorably acting directly onto the backside of the soft layer providing a conformal contact between said stamp and the substrate.

The press means itself can be like a flat stamp having a stamp plane which contacts the soft layer in a flat area.

Alternatively the press means is built like a roller element which contacts the backside of the soft layer with its curved contour. Here the contact area between the roller element and the backside of the soft layer is more of a linear shape. The roller element provides in a preferred embodiment a cylindrical press element rotating around it's longitudinal axis having a rigid cylindrical surface acting onto the soft backside of the soft layer. This embodiment is suitable for mechanized large area printing because the inventive hybrid stamp device can be continuously pressed against the surface of the substrate step by step till the whole patterned layer of the stamp gets in contact with the surface.

In a third embodiment the press means is built as a drum having a cylindrical curved rigid surface to which the backside of the soft layer is contacted. The stamp surface is then rolled over the substrate so that the patterned layer of the stamp gets in transient contact to the surface of the substrate.

In a fourth embodiment the press means is built as a drum having a cylindrical curved rigid surface covered with a soft layer. The stamp is initially picked up onto the soft layer and, in a second step, during the rolling motion, brought into close flat contact to the surface of the substrate and left in place. Here a typical radius of the drum is about 0.05–1 m.

The before described press means are characterized by a rigid surface due to the fact that the soft layer is already provided onto the backside of the rigid carrier layer of the stamp device. The second and fourth inventive embodiment of the stamp device for printing a pattern on a surface of a substrate comprises also a two-sided rigid carrier.layer providing on its first side a patterned layer made of a first material but its second side still remains rigid, no soft layer is attached like in the first case. Rather a contact means is provided for contacting the second side of said carrier layer by applying a force onto said stamp. The contact means for example in the form of a roller or cylinder element has at least one soft layer at its outer contour being of softer material than said first material of said patterned layer. Such roller element has a cylindrical shape providing the soft layer at its superficies and contacts the stamp device in a propagating contact front while unrolling at the backside of the rigid carrier layer of the stamp device. The loading force of the roller or cylinder element on the stamp device and substrate can be varied corresponding to the stamp patterns to yield best print results. The roller or cylinder with a soft surface layer further allows to compensate for variations in stamp thickness and substrate topography. To prevent sliding of the stamp on the cylinder or sliding of the roller on the stamp a good friction between the soft layer and the hard surface is ensured if there is a friction coefficient between the soft layer and the rigid carrier layer of about 0.5–1.

The rigid carrier layer is preferably made of a metal, a glass or quartz foil which is rigid in x-y plane but flexible in perpendicular direction so that bending the carrier layer along a curved form like a cylindrical superficies is possible. A typical foil thickness ranges about 150 microns and down to a few microns.

For obtaining good print results it appears that the thickness of the soft layer should be thicker than the sum of the thickness of the elastomeric stamp layer plus the elastomeric pattern layer and should be softer preferably at least 5 times softer than the material of which the patterned layer consists of. The patterned surface of the stamp provides structures which contours will be transferred to the surface of the substrate during printing. The depth of said structure is typically 1–3 $\mu$m.

Although the soft layer between the force inducing means and the stamp device serves as a load dissipating layer avoiding any load peaks or local load deficits which may lead to insufficient printing results, it is of great interest to monitor and/or control the actual load acting onto the stamp device in all directions of space while printing. With the actual load information while printing it will be possible to intervene the printing process by specific regulations of the applied force acting onto the stamp device. Also in respect of securing quality of printed substrate its valuable having an evidence about the printing results in the form of recorded measurement data.

For this the patterned layer of the stamp device provides a force transducer, which may be any device, as known in the art, for force or pressure measurement in at least one force transducer zone for monitoring the normal force induced pressure on the stamp device acting between said stamp and said substrate. The force transducer zone serves as a force detector having a defined patterned structure surrounding at least an area unencumbered by pattern structures and in said unencumbered area additional structures are provided which narrow the unencumbered area in at least one direction.

The underlying principle of the force detector is using the effect of sagging of structure free areas of the patterned layer by force influence onto the stamp. The structure free areas are of a defined dimension getting in contact with the substrate since a specific load is exceeded. The smaller the defined structure free areas the higher the load has to be for establishing a contact. In this way a scaled measuring pattern can be produced by providing some structure free areas of several different defined dimensions onto the patterned layer preferably at the boundaries of the stamp.

Lateral forces acting on the stamp are measured by the fact that wider structures are less displaced from their equilibrium position than narrow lines. An array of lines with variable width allows measurement of lateral forces acting perpendicular to the direction of the lines and parallel to the plane of the stamp. Providing a second array of lines oriented perpendicular to the direction of the first array allows measurement of lateral forces acting in a direction perpendicular to the forces being measured by the first array. With the entire set of force transducers described above normal forces as well as lateral forces acting onto the surface of the substrate through the stamp can be measured and distinguished from each other which will be described in detail in reference to the figures.

In case transluminescent materials are used for the stamp device as well as for the substrate the printing arrangement can be illuminated with a sensing light for detecting contact areas between the stamp and the substrate while printing. With this technique an online control of the printing process can be carried out which improves the yield and ensures the printing accuracy and quality. When either substrate or stamp are transluminescent, a similar sensing circuit can be implemented that relies on detection of reflected light instead.

The patterns which have to be transferred onto the substrate are very different in structure and in dependency of the technological demands large areas of the surface of the substrate have to be clear of any printing contacts although they will be covered by the stamp device during printing. The larger these areas the more the tendency raises of local sagging of the non supported patterned layer onto the surface leading to unintentional uncontrolled contaminations of the substrate with the ink. There are two ways to avoid these uncontrolled contaminations:

In a first way support structures, like posts or lines, are provided at the patterned layer in said areas free of structures for preventing said areas free of structures from sagging and contacting said substrate by applying a load onto said stamp device. Unavoidable by using these support structures are local contacts between the stamp device and the substrate in areas in which contacts should have been avoided. However support structures lead to controlled prints at the surface of the substrate which can be arranged apart from the main desired printing pattern without interfering said pattern.

Such support structures shall provide maximally the same structure depth as the patterned structures at the patterned layer and being preferably of the same material or of harder material like poly methyl methacrylate (PMMA). In case a different material is used for the support post the ink transfer efficiency on these patterns from the inking solution to the substrate surface can be reduced in order to minimize the printing traces left by those support posts. The overall transfer efficiency can be reduced by (i) treating the support post surface to make it reject the ink during the inking process or (ii) by treating the support post surface to retain the ink during the printing process.

The other way of preventing uncontrolled contacts between the stamp device and the substrate is omission of material of the patterned layer in these critical areas which tend to sag and contact said substrate by applying a load onto said stamp device. By omitting material in the patterned layer recesses are formed which are limited at one side by the rigid carrier layer itself. However it is also possible to just omit the material of the patterned layer partially.

Forming the recesses into the patterned layer as mentioned before, the resultant little cavities will be enclosed between the stamp device and the substrate after the contacting of the patterned layer on the surface of the substrate. If additional passage channels through the stamp device are provided for supplying the cavities with a fluidic medium or a gas, this then leads to a fluidic or gas network which is enclosed by the stamp device and the surface of the substrate which enables the realization of controlled chemical or biological reactions on a surface of a substrate or in the volume which is enclosed by the cavities.

Using the stamp device like a frame in which the reactions defined before can take place the stamp device will not be used for printing in a way of offset printing, i.e. printing takes place at locations on the substrate where the structures of the patterned layer contact the surface of the substrate. Printing is also possible in style of Intaglio printing i.e. printing takes place where a channel system in the patterned layer is enclosed also by the surface of the substrate which is wetted by a fluid flowing through the channel system. Other applications are also conceivable in which printing combined with the before standing idea of the fluidic or gas network are technologically useful.

Also it is possible to insert a gaseous medium through the passage channels into the cavities to establish a controlled overpressure in said cavities for preventing sagging by application of a load onto said stamp device.

Another important aspect of mechanized large area printing is the printing accuracy with which the stamp device and the substrate will get in contact, in particular in cases in which the substrate does have already structures on it's surface which have to be considered for further printing processes. Using known techniques of alignment for printing processes like described in WO 97/06012 an accuracy of the order of 1 micrometer is attainable. Most current devices require overlay accuracies much better than 1 micrometer in order to be functional. It is true that self-alignment cannot improve the accuracy of a print itself on a non-patterned substrate but print process of subsequent layers will adapt to the inaccuracies of the first layer. Most devices fabricated lithographically do not need ppm—scale accuracy levels per se. The main reason for the high level of accuracy that is used in manufacturing today is the need for overlay. Overlay errors of 0.1 microns will change the properties of a FET on a 256 Mbit DRAM for example and create a defect (relative error of 0.1 micron over 100 mm is 1 ppm). A relative size error of 1 ppm of the conducting channel of the FET will go unnoticed even though the relative accuracy budget for both cases is the same.

The known mechanism for self-alignment relies as it is disclosed in the WO 97/06012 on a lock and key mechanism on a flat backplane. For this on the substrate as well on the stamp means for self-alignment are provided in form of wedge shaped protrusions of the stamp (key elements) fitting exactly into corresponding recesses (lock elements) of the substrate. The major problem of this proposed self-alignment scheme is that the self-alignment means have to match, at least in part, already before the alignment step. For large inaccuracies where the protrusions and recesses do not partially overlap, self-alignment does not work.

Instead of protrusions and recesses of a constant shape and size the advantageous idea for designing improved self alignment elements for printing on a prepatterned substrate is to use key elements of variable size, i.e., the protrusions are of smaller size than the recesses first, so that they guarantee to match with the specified coarse or pre-alignment specifications, and become larger till they fit exactly into the recesses as described in the following.

The printing process is normally characterized by a rolling contact between the stamp device and the substrate. The contact line between the patterned layer and the substrate is at least near the contact line of a cylindrical shape and propagates in one preferred printing direction. Preferably the lock and key elements are arranged in a row along the printing direction on the stamp device respectively substrate facing each other. As the cylindrical stamp propagates along the printing direction the key elements become larger and larger until there is no more mismatch between lock and key element. At this place the stamp is then locked on target and can start with the printing of the useful pattern.

Of course it is also possible to change the shape and size of the lock elements and adapt their size to the size of the key elements being of constant shape and size. Finally the accuracy of the impress of the patterned layer onto the substrate can be influenced negatively due to the different thermal expansion behaviors of the patterned layer and the carrier layer. Since the temperature while printing differs normally from the temperature while producing the stamp device, i.e. while joining the carrier layer and the patterned layer, distortions can appear while printing caused by a different expansion between carrier and patterned layer. For avoiding this disturbing effect it is recognized that the patterned layer, which should be of a material having an thermal expansion coefficient being typically greater than the thermal expansion coefficient of the rigid carrier layer, shall be joined onto the rigid carrier layer in a stretched manner.

DESCRIPTION OF THE DRAWINGS

The invention is described in detail below with reference to the following schematic drawings. It is to be noted that the figures are not drawn to scale.

FIG. 6 A Schematic sketch showing self-alignment lock and key structures and

FIG. 6 B, C Sketches showing rolling lock-in self-alignment in progress.

DESCRIPTION OF THE PREFERRED EMBODIMENTS

Figure 1A:
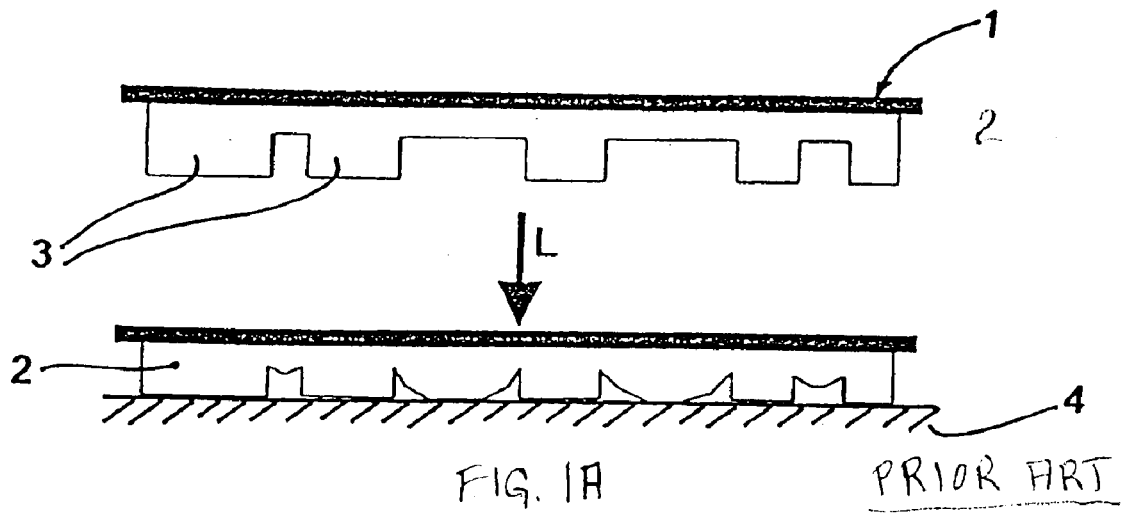
FIG. 1A Stamp device according to state of the art.

FIG. 1 shows a conventional stamp device having a backplane or in terms of this disclosure a carrier layer 1 typically made of a metal foil or a thin glass or quartz plate. On its one side a patterned layer 2 is applied having patterned structures 3 which are moistened at least on its lower side with an ink or a chemical or biological substance which shall be transferred to the surface of a substrate 4 by a printing process. While printing, the stamp device is pressed under a load L against the surface of a substrate 4 as illustrated in FIG. 1A lower sketch. Due to mechanical compression caused by uneven distribution of the load L onto the stamp, deformation appears and squeezes the pattern structures 3 and creates sagging in non supported regions.

Figure 1B:
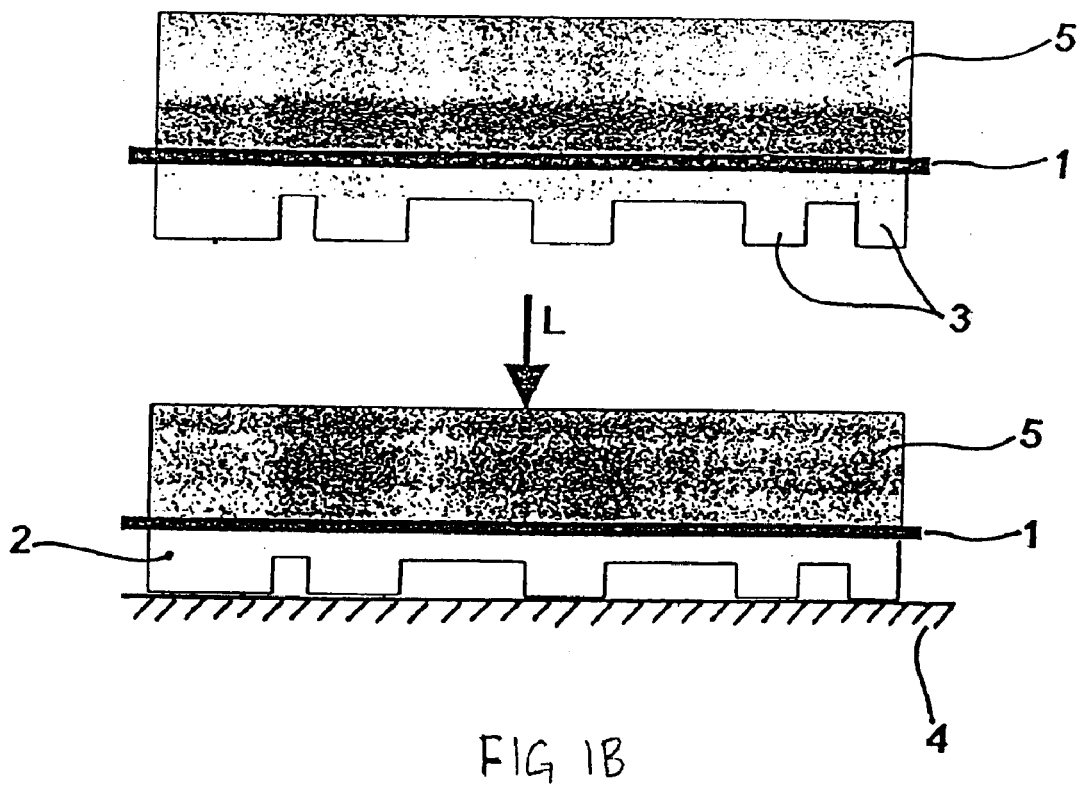
FIG. 1B Stamp device with soft layer.

When using a soft pattern 5 which is attached at the other side of the carrier layer 1 as it is shown in FIG. 1B no sagging appears under load. The soft layer 5 absorbs the deformation by distributing the load and leaves the pattern structure 3 unchanged.

The material of which the soft layer 5 is made of provides a compression modulus which is at least 5 times smaller than the compression modulus of the patterned layer 2. Typically the soft layer 5 provides a Young modulus of 0.6 MPa (21 Shore A) whereas the stamp material of which the patterned layer is made of, like PDMS, provides a Young modulus of about 3 MPa. Also the thickness of the soft layer 5 should be much bigger than the thickness of the stamp 2. A typical layer thickness of the soft layer 5 is about 2 mm whereas the stamp is about 200 μm and thinner. The carrier layer 3 is made of a rigid material which is rigid in the plane of the layer, i.e. rigid in the x-y-plane but flexible perpendicular to this plane, so that the stamp device can be curved for example around the superficies of a cylinder.

Figure 2A:
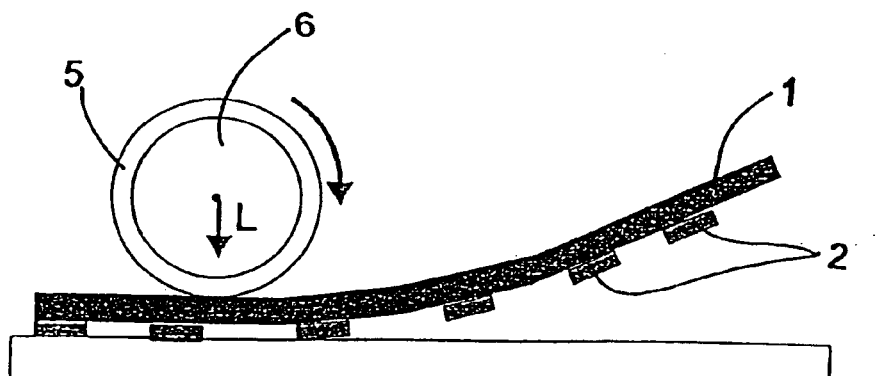
FIG. 2A Stamp device with soft roller element.

In FIG. 2A an alternative embodiment the stamp device is shown consisting of the carrier layer 1 and the patterned layer 2 as it is known from the state of the art For printing, a roller element 6 is used providing on its superficies the soft layer 5 which is pressed under Load L against the backside of the carrier layer 1. The roller element 6 brings the patterned layer 2 in contact with substrate 4. The stamp device consisting of the carrier and the patterned layers is kept with distance from the substrate 4 before getting in contact by the roller element 6 and is slightly curved with a radius of curvature which is much larger than the radius of the roller element 6 thus reducing pattern distortion.

Figure 2B:
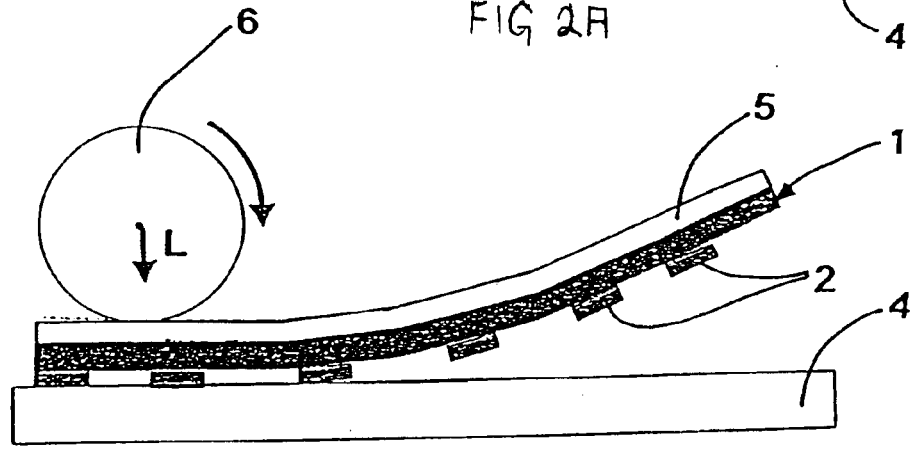
FIG. 2B Stamp device with soft layer and roller element.

In FIG. 2B, the stamp device provides on it's backside of the carrier layer 1 the soft layer 5. The roller element therefore does not need any soft layer so that a naked roller element 6 with a hard superficies which is pressed against the soft layer 5 for printing can be used.

Figure 2C:
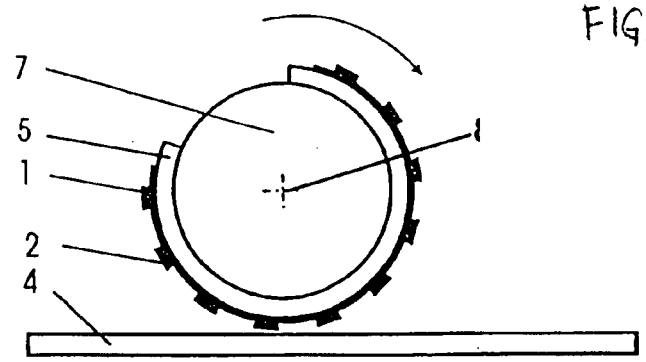
FIG. 2C Stamp device with a cylinder as main element.
Figure 2C:
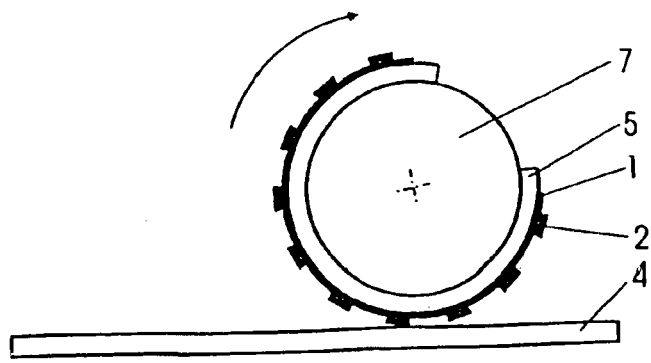

FIG. 2C shows the use of a cylinder printing tool 7 at two phases of its movement from left to right along the substrate surface. Different areas of the patterned stamp surface 2 contact the surface and the solid backplane 1 along with the soft layer 5 help to level out warping of substrate and inaccuracies of stamp 2 and cylinder 7. The cylinder 7 rotates around it's axis 8. The main advantage of the cylinder printing tool 7 over the roller shown in FIGS. 2A and B is that mounting of the thin film stamp on the surface of the cylinder keeps the effective radius constant and thus the bending induced deformation at constant level. As in FIG. 2B, the soft layer 5 can also be fixed to the cylinder, and the stamp with its backplane be mounted onto the 'soft' cylinder surface by mechanical means, by adhesion, or by vacuum.

For reaching printing results of high quality the control over contact front and print forces between the stamp device and the substrate is crucial for mechanized large area printing. The use of a roller or cylinder element combines the advantages of the thin film stamp device and a roller approach. The thin film stamp provides the dimensional accuracy of the print whereas the rolling technique results in a propagating contact front which is advantageous for mechanized large area printing. The loading force of the roller or cylinder element on the thin film stamp and substrate can be varied corresponding to the stamp patterns to yield best print results. A roller or cylinder element with a soft surface further allows to compensate for variations in stamp thickness and substrate topography.

FIGS. 3A–F show several embodiments of force detectors in form of force transducer zones which are provided at the patterned layer preferably located at the margin of the patterned layer for monitoring the total load, uneven loads, and shear force on the stamp.

Figure 3A:
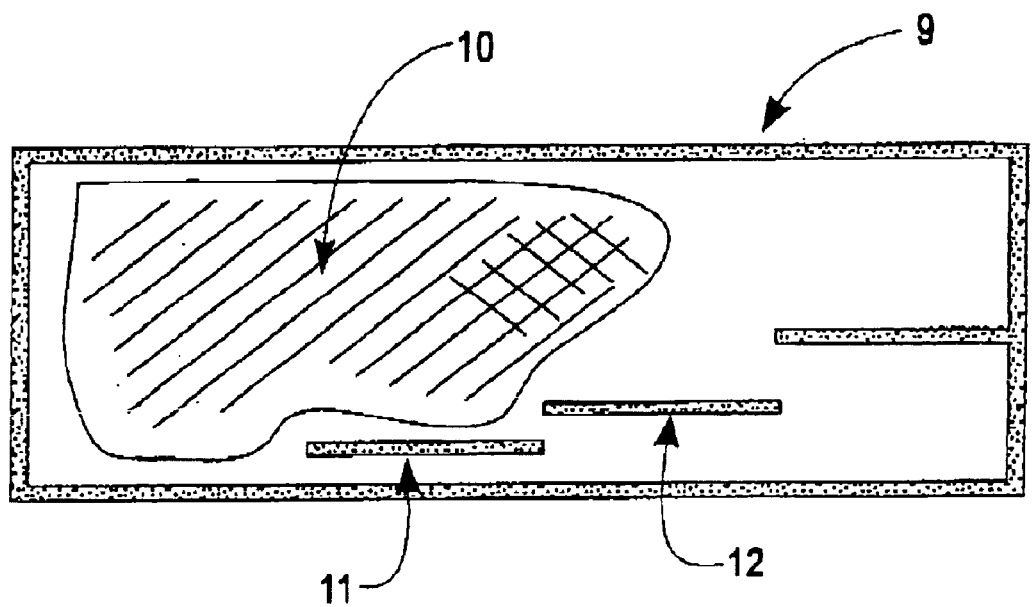
FIG. 3A Force detector pattern for detecting normal forces

A force transducer zone 9 for monitoring normal forces is shown in FIG. 3A. The black lines shall represent pattern structures which stay in contact with the substrate while printing. The transducer zone 9 provides an area which is wide on the left side and gradually narrows towards the right side. The hatched zone 10 shows how the additional area of contact for a soft stamp might look like. From the size of this zone 10, the relative stability toward sagging of the stamp can be derived. Collapse up to the first step 11 of the staircase means high relative stability, collapse up to the second step 12 means lower relative stability (see crosshatched area) and so forth. Below the staircase there is another zone that starts collapsing when the stamp has a very low relative stability and/or the force acting onto the stamp is very high so that sagging appears in the very narrow areas.

Figure 3B:
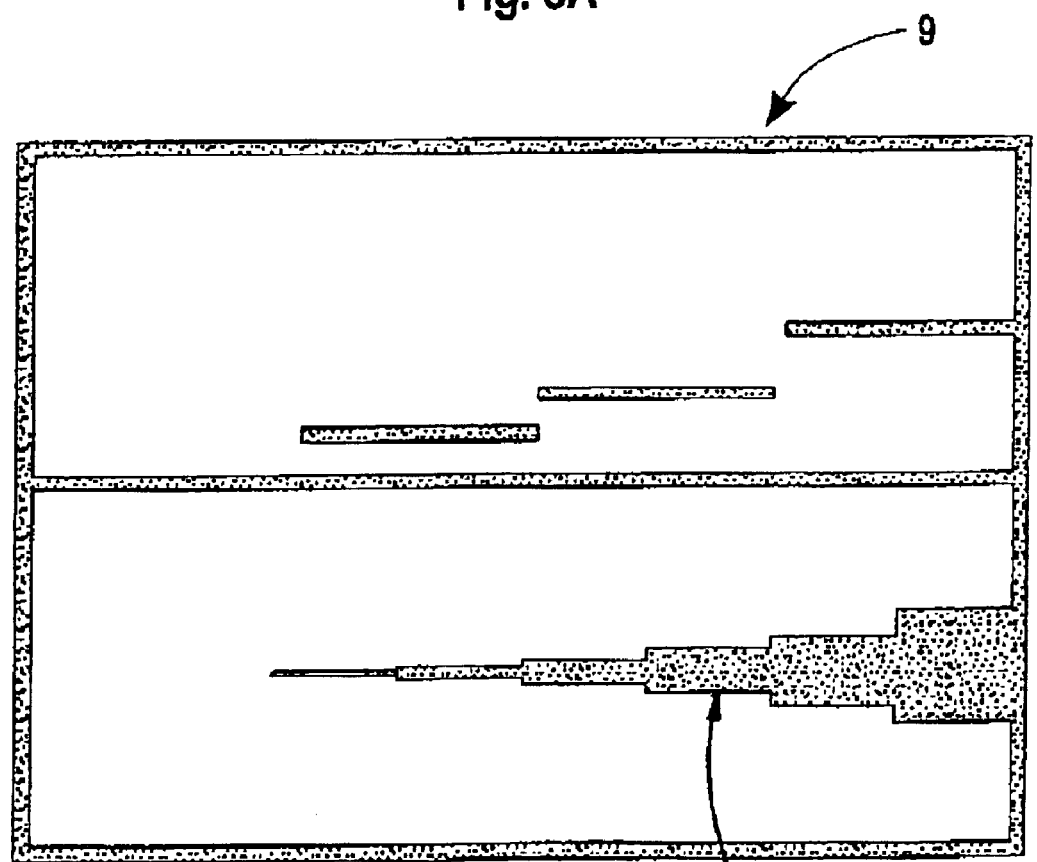
FIG. 3B Combined force detector pattern for detecting normal and lateral forces
Figure 3C:
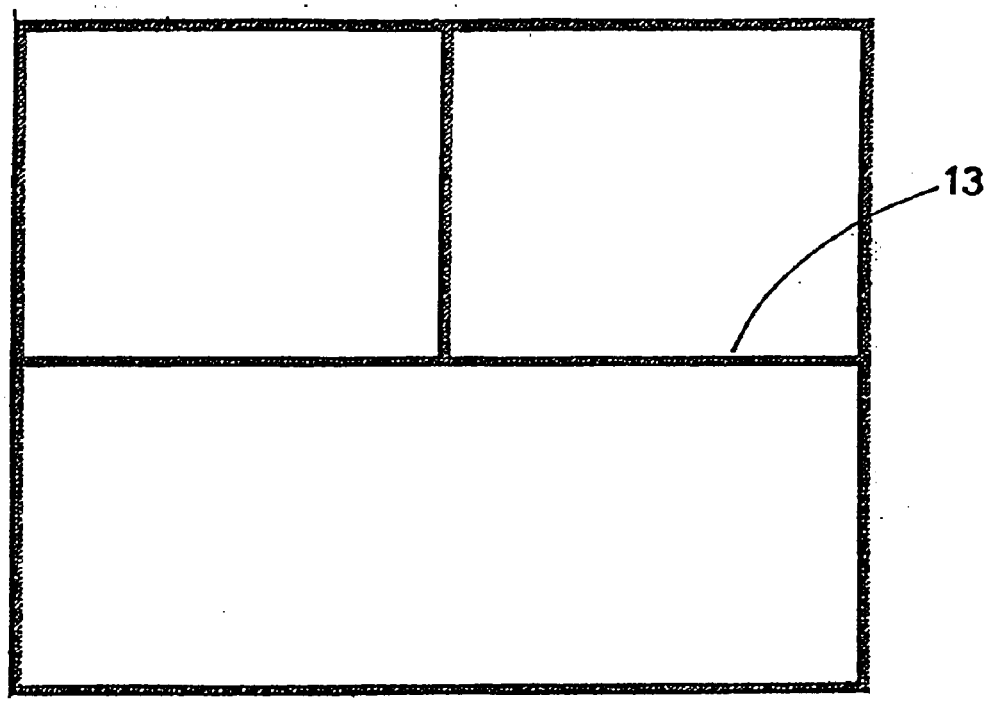
FIG. 3C, D, E Alternative embodiments for force detector patterns.
Figure 3D:
FIG. 3F Arrangement of force detector patterns on the patterned layer.
Figure 3E:
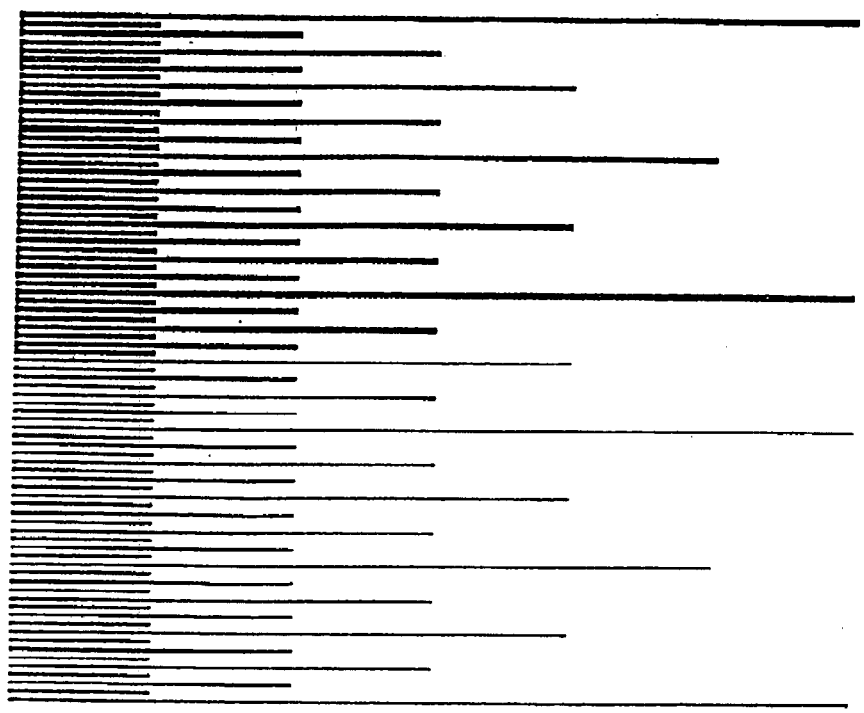

FIG. 3B shows a combined collapse vernier with structures as in FIG. 3A and structures with lines 13 of variable thickness. The structure in FIG. 3B is implemented with a smaller scale factor and thus detects stronger loads than the enlarged counterpart. Another embodiment is shown in FIG. 3C. The smaller the area is, which is enclosed by the line shaped patterned structures, the more load must act onto the stamp device until a contact is reached in this area A force transducer zone for monitoring lateral or shear forces is shown in FIG. 3D. The structure on the upper half with the narrow bridge at the right that becomes larger towards the left side is to detect the stability of the stamp device against squeezing of small structures and shear forces during printing perpendicular to this narrow bridge. A shear force will induce a lateral displacement of the line from its original symmetry axis. A somewhat differently patterned zone is evident from FIG. 3E.

Figure 3F:
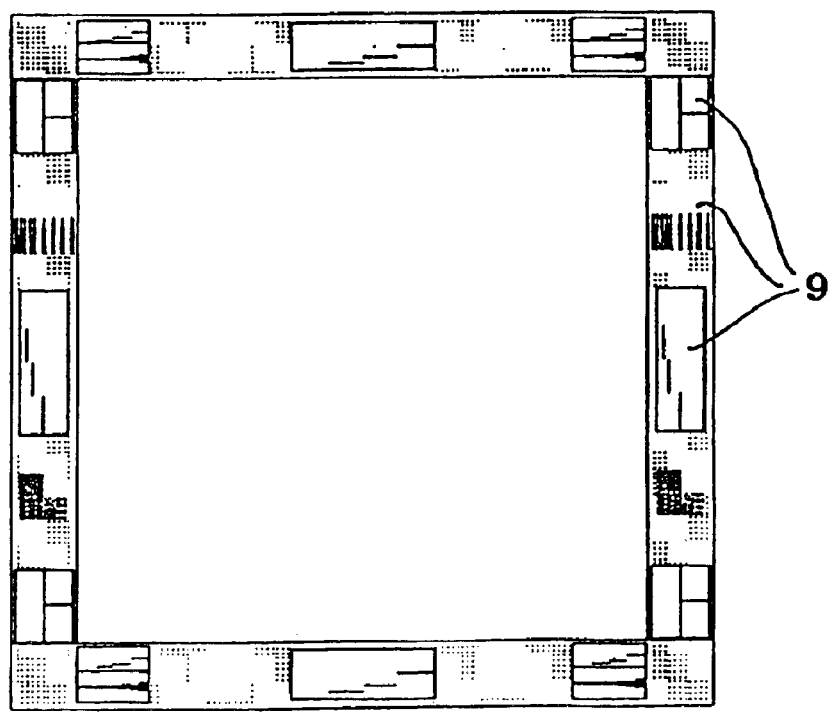

FIG. 3F shows the arrangement of force transducer zones 9 at the margin of a square shaped stamp device from the bottom view. In the center region of the stamp device patterned structures 3 are located (not shown). Measuring the width of the additional contact due to sagging (zone 10 in FIG. 3A) in one or more of these zones (force transducer zones 9 in FIG. 3F) allows for deriving of the pressure exerted by the stamp device against the substrate in the transducer zones. The overall force acting on the stamp device is calculated using the arithmetic average pressure among several force transducer zones. The absolute pressure is either inferred from a calibration run (zone width versus calibration pressure) or by model calculations.

Figure 4A:
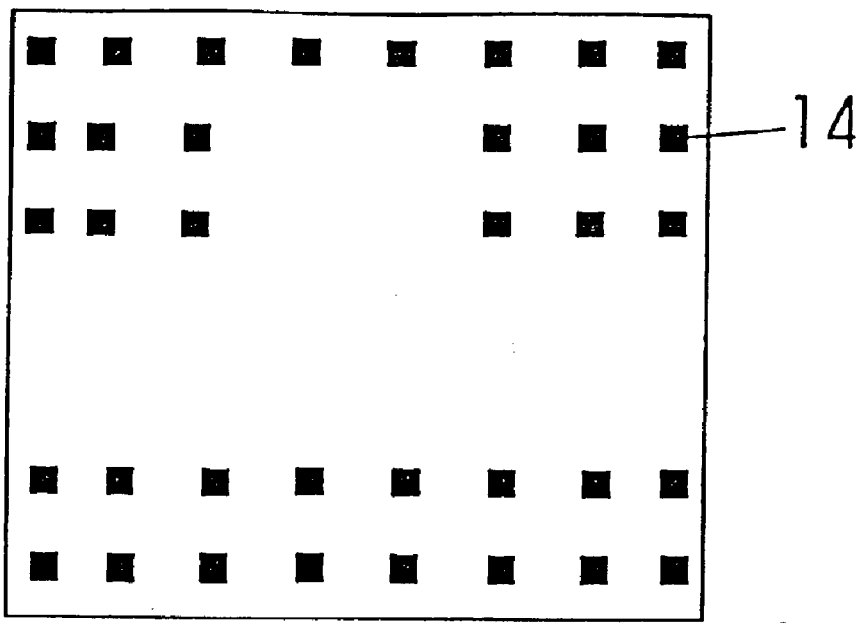
FIG. 4A, B Arrangement of support elements.
Figure 4B:
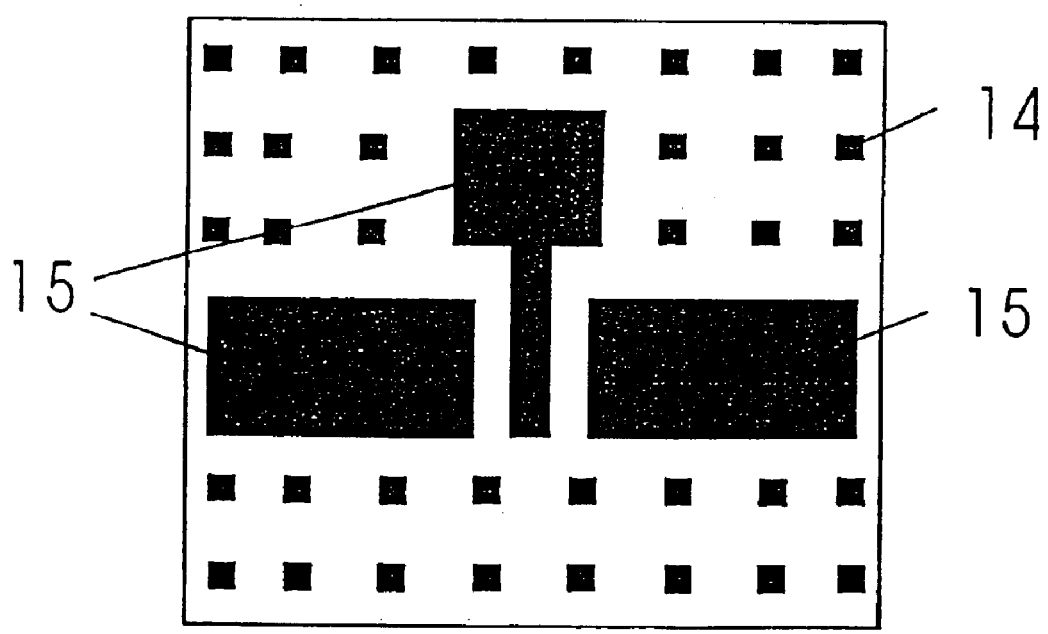

FIG. 4 shows support structures 14 added to the desired pattern 15 which is provided in the white fields and shown in detail in FIG. 4B. The support structures are needed to successfully print without sagging in great areas in which no desired structures are provided. In this embodiment, the support structures 14 are square 200 micron posts that are spaced by 450 micron. In general, the support structures 14 have to be close enough to avoid the beginning of sagging. In other words, they have to cover a sufficient area fraction to resist the printing force induced squeezing. In the example of 200 micron posts, the spacing could vary from 400 to 1000 microns which results in an area coverage of ¼ or ⅕. Elongated support structures like lines are equally useful. They prevent collapse at an even lower area coverage than posts but may obstruct desired structures that need to cross the supported zone.

Figure 5A:
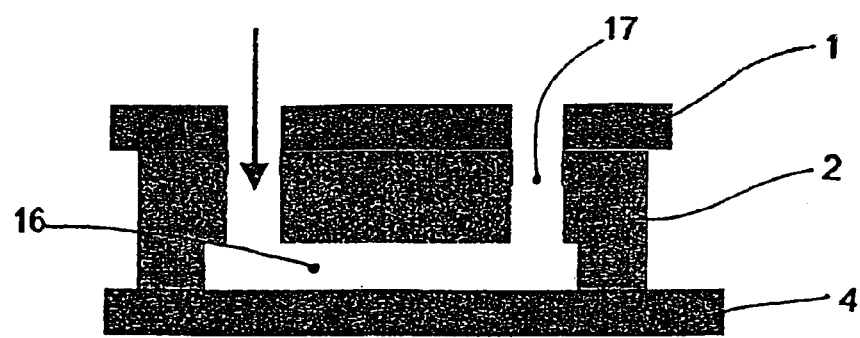
FIG. 5 A, B Stamp device used as a microfluidic or gas network.

Thin stamp devices can also be used in conjunction with highly accurate microfluidic or gas networks. FIG. 5A shows a modified stamp device having a carrier layer 1 and the patterned layer 2 and being contacted to the substrate 4. The patterned layer 2 provides a recess 16 forming a chamber which is connected with two passage channels 17, through which a fluid or gas can flow. This stamp arrangement can serve as a micro reaction chamber for chemical and/or biochemical processes which can take place in the chamber or at the surface of the substrate 4.

Figure 5B:
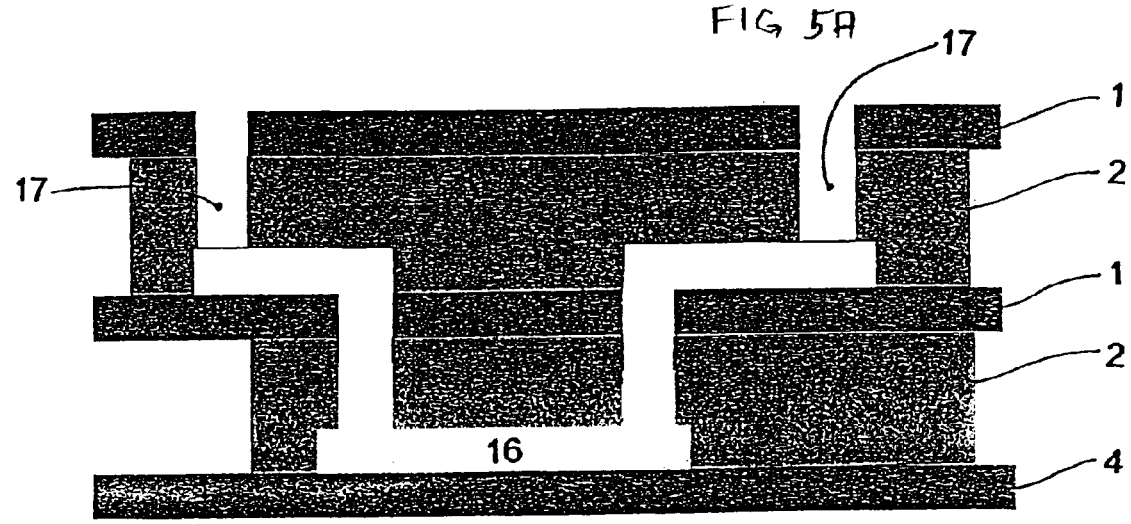

This scheme can also be extended to multiple layers. The second layer microfluidic or gas network with its passage channels is placed on the first layer and allowed to establish a seal with the first layer as shown in FIG. 5B. From theoretical considerations, it can be established that the combination of three layers like the one shown in FIG. 5B is sufficient to allow access with a multiple of fluids or gasses to any place on the substrate with just one access channel per fluid or gas type. However it should be considered that no intersections between two channelsystems in one and the same plane should appear so that there is no mixing of two separate mass flows.

In FIG. 6A, an improved way for automatically locking-in self-alignment between the patterned layer 2 of the stamp device and the surface of the substrate 4 is illustrated. At the region of the margin of the patterned layer 2 as well at substrate 4, key 18 and lock 19 elements are provided. The key elements 18 which are placed onto the patterned layer 2 provide variable size and shapes and are at the left side of the patterned layer of smaller size than at the right side. In difference, the lock elements 19 are located at the surface of the substrate 4 and facing into key elements 18 of patterned layer 2. Both key 18 and lock 19 elements are arranged in one linear row which direction is the direction of propagation in which the stamp device gets in contact with the substrate while printing as it is described in FIG. 2.

In FIGS. 6B and C, the progress of lock-in self-alignment is shown. In the touch-down region at the left side a mismatch (dx1=10) still allows the lock and key elements to find the matching targets. As the stamp rolls from left as shown in Figure B, to the right as shown in Figure C, the mismatch is gradually reduced until the stamps lock into the exact position (dx2<0.1). The arrows show the force vectors generated by the mismatching lock and key elements that help to displace the stamp back into its desired position upon rolling.

The small key elements 18 at the right side of the patterned layer and the greater lock elements 19 guarantee to match with the specified coarse or pre-alignment specifications shown in FIG. 6A.

The printing process is normally characterized by a rolling contact between the stamp device and the substrate 4. The contact line between the patterned layer 2 and the substrate 4 is at least near the contact line of a cylindrical shape and propagates in one preferred printing direction. Lock and key elements are arranged in a row along the printing direction on the stamp device and the substrate facing each other. As the cylindrical stamp propagates along the printing direction the key elements 18 become larger and larger the stamp is then locked on target and can start with the printing of the useful pattern. At the time of printing, there is no more mismatch between the lock and key element as shown in FIG. 6C. At this place, the periphery of the useful patterns have additional self-alignment during the whole print despite the possible deformations of stamp and/or substrate. Besides the use of said key and lock elements for ensuring perfect alignment structures which are already on the substrate, key and lock elements can also be used for alignment control while printing.

Ultimately, lock-in self-alignment schemes can be made so that no optical alignment will be necessary anymore. Pre-alignment will be done with mechanical banking pins with typical placement accuracy of 10 micrometers and lock-in self-alignment will take over from that starting point and carry alignment to the sub 0.5 micron level.

Alternatively, the pyramidal shape of the lock and key elements as shown in the drawing may be replaced with other tapered shapes like a triangle shape, with slanted or vertical sidewalls.

Having thus described our invention, what we claim as new and desire to secure by Letters Patent are:

1. Stamp device for printing a pattern on a surface of a substrate, said device having a two-sided rigid carrier layer providing on a first side thereof a patterned layer made of a first material and being combined on a second side opposite said first side with a soft layer made of a softer material than said first material, said patterned layer being stretched to selectively compensate for thermal, chemical, and mechanically induced deformation of said patterned layer to result in accurate prints; said carrier layer describes an x-y-plane in which said carrier layer is rigid and said carrier layer is flexible in a direction perpendicular to said x-y-plane; said patterned layer providing at least one force transducer zone arranged proximate the margin of said patterned layer for monitoring a force induced load acting between said stamp and said substrate.

2. Stamp device according to claim 1, wherein said force transducer zone provides a patterned structure in said patterned layer along the stamp margin surrounding at least an unencumbered area, and proximate said unencumbered area there are provided contoured structures in said patterned layer which bound the unencumbered area of said layer in at least one direction.

3. Stamp device according to claim 2, wherein said soft layer is of a thickness which is greater than the combined thickness of said patterned layer and of a stamp layer.

4. Stamp device according to claim 3, wherein said structure depths in said patterned layer are less than the thickness of said soft layer.

5. Stamp device according to claim 1, wherein said force transducer zone provides a patterned configuration surrounding at least an unencumbered area; and separating means which divide said unencumbered area into at least two unencumbered surface sections.

6. Stamp device according to claim 1, wherein said carrier layer is selected from a material consisting of a metal foil, thin glass or quartz substrate.

7. Stamp device according to claim 1, wherein said soft layer includes a backside and said stamp device comprises a press for directing a force against said backside for contacting said patterned layer with said surface of said substrate.

8. Stamp device according to claim 7, wherein said press comprises a roller element forming a cylindrical press having an at least partially cylindrical surface.

9. Stamp device according to claim 1, wherein said force transducer zone provides a patterned structure surrounding at least an area free of structures and proximate said area free of structures there are provided structures which bounds the area free of structures in at least one direction.

10. Stamp device according to claim 1, wherein said force transducer zone provides a patterned structure surrounding at least an area free of structures; and linear structures are provided which divide said area free of structures in at least two sections.

11. Stamp device according to claim 10, wherein at least two linear structures being arranged perpendicular to each other and dividing said area free of structures at least into three sections.

12. Stamp device according to claim 1, wherein said force transducer zone is placed in an area near an edge of said patterned layer.

13. Stamp device for printing a pattern on a surface of substrate, said device having two-sided rigid carrier layer providing on a first side thereof a patterned layer made of a first material and being combined on a second side opposite said first side with a soft layer made of a softer material than said first material, said patterned layer being stretched to selectively compensate for thermal, chemical and mechanically induced deformation of said patterned layer to result in accurate prints; said carrier layer describes an x-y-plane in which said carrier layer is rigid and said carrier layer is flexible in a direction perpendicular to said x-y-plane, wherein said patterned layer includes patterned structures for contacting said surface of said substrate and the first material of said patterned layer is at least partially omitted so as to form at least one recess and wherein at least one passage channel breaks through said carrier layer into said at least one recess for creating a fluidic or gas network between said surface of said substrate and said stamp device.

14. Stamp device according to claim 13, wherein there are provided at least two said passage channels comprising an inflow channel and an outflow channel for said fluidic or gas network.

15. Stamp device according to claim 13, wherein at least two layers of said fluidic or gas network are stacked on top of each other and having communicating passage channels in said at least one recess in said layers to allow formations of multidimensional networks providing access to a multitude of substances at a multitude of locations without level intersections.

16. Stamp device for printing a pattern on a surface of a substrate, said device having a two-sided rigid carrier layer providing on a first side thereof a patterned layer made of a first material and being combined on a second side opposite said first side with a soft layer made of a softer material than said first material, said patterned layer being stretched to selectively compensate for thermal, chemical and mechanically induced deformation of said patterned layer to result in accurate prints; said carrier layer describes an x-y-plane in which said carrier layer is rigid and said carrier layer is flexible in a direction perpendicular to said x-y-plane, wherein said stamp device forms said patterned layer, and the surface of said patterned layer comprises self-aligning means providing for an accurate relative positioning relative to the substrate during printing of said pattern.

17. Stamp device according to claim 16, wherein unencumbered areas on said patterned layer are connected to a closed further fluidic network and are pressurized through said at least one passage channel to prevent said areas from sagging and contacting said substrate upon the applying of a load onto said stamp device.

18. Stamp device according to claim 16, wherein said self-aligning means comprises key elements for engaging lock elements of a constant shape and distance, and said key elements are of variable shape dimensionally smaller than said lock elements and increasingly larger for fitting without any mismatch into said lock elements.

19. Stamp device according to claim 18, wherein said key elements have tapered flanks for engaging tapered flanks on said lock elements.

20. Stamp device according to claim 18, wherein said key elements are arranged in a row along which said patterned layer and said substrate are brought into contact.

21. Stamp device according to claim 18, wherein said patterned layer comprises said key elements for engaging lock elements on the surface of said substrate.

22. Stamp device according to claim 16, wherein said patterned layer provides patterned structures for printing said surface of said substrate, said patterned structures being separated from each other by areas free of structures; and support structures selectively in the form of posts or lines, are provided for preventing said areas free of structures from sagging and contacting said substrate by applying a load onto said stamp device.

23. Stamp device according to claim 22, wherein said support structures having maximally the same structure depth as said patterned structures and selectively being of the same material or of a harder material.

24. Stamp device according to claim 16, wherein said patterned layer provides patterned structures for printing said surface of said substrate and said patterned structures being separated from each other by areas free of structures and in said areas free of structures the first material of said patterned layer is at least partially omitted forming a recess for preventing said areas free of structures from sagging and contacting said substrate by applying a load onto said stamp device.

25. Stamp device according to claim 16, wherein said patterned layer provides patterned structures for contacting said surface of said substrate and said patterned structures being separated from each other by areas free of structures and in said areas of structures the first material of said patterned layer is at least partially omitted forming a recess, and wherein at least one passage channel breaks through said carrier layer into said recess for creating a fluidic or gas network between said surface of said substrate and said stamp.

26. Stamp device according to claim 25, wherein at least two passage channels are provided, one inflow channel and an other outflow channel for a fluid or gaseous media.

27. Stamp device according to claim 26, wherein said areas free of structure and connected to a closed gaseous network are pressurized through said at least two passage channels to prevent those areas from sagging and contacting said substrate by applying a load onto said stamp device.

28. Stamp device according to claim 25, wherein at least two layers of said fluidic or gas network are stacked on top of each other to allow formation of multidimensional networks providing access to a multitude of substances at a multitude of locations without level intersections.

29. Stamp device according to claim 26, wherein said first material of said patterned layer has a thermal expansion coefficient which is greater than the thermal expansion coefficient of said rigid carrier layer.

* * * * *